Figure 1:
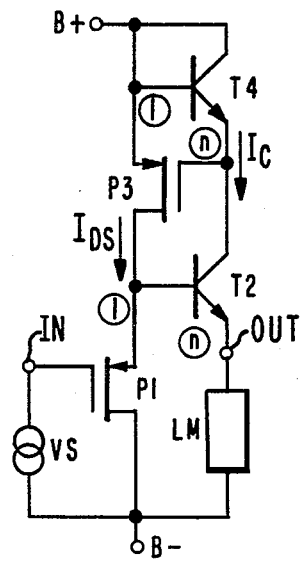

United States Patent [19]

Limberg

[11] 4,420,726

[45] Dec. 13, 1983

[54] VOLTAGE-FOLLOWERS WITH LOW OFFSET VOLTAGES

[75] Inventor: Allen L. Limberg, Titusville, N.J.

[73] Assignee: RCA Corporation, New York, N.Y.

[21] Appl. No.: 271,026

[22] Filed: Jun. 4, 1981

[51] Int. Cl.³ .............................................. H03F 3/16
[52] U.S. Cl. .................................... 330/288; 330/257; 330/296; 330/300; 330/311
[58] Field of Search ................ 330/257, 288, 296, 300, 330/310, 311

[56] References Cited

U.S. PATENT DOCUMENTS

| | | |
|---|---|---|
| 3,746,893 | 7/1973 | DeBretagne ........................ 307/304 |
| 3,974,456 | 8/1976 | Russell et al. . |
| 4,008,441 | 2/1977 | Schade, Jr. ......................... 330/288 |
| 4,228,404 | 10/1980 | Widlar ................................ 330/267 |
| 4,241,314 | 12/1980 | Iwamatsu ........................... 330/253 |
| 4,345,213 | 8/1982 | Schade, Jr. ......................... 330/253 |
| 4,371,792 | 2/1983 | Dobkin ............................... 307/255 |

OTHER PUBLICATIONS

O. Horna, "A 150 Mbps A/D and D/A conversion System", *Comsat Technical Review*, vol. 2 No. 1, Spring 1972, pp. 39–57.

J. Roberts et al., "MOS-Bipolar Amplifiers", *Wireless World*, Jul. 1969, pp. 328–330.

Widlar, R. J., "Low Voltage Techniques", *IEEE Journal of Solid-State Circuits*, vol. SC-13, No. 6, Dec. 1978, pp. 838–846.

Ahmed, A. A., "Zero-Offset Potential Follower Circuits", RCA Corp. Technical Note No. 938, Sep. 1973.

Erdi. G., "A 300 V/µs Monolithic Voltage Follower", *1979 IEEE International Solid-State Circuits Conference*, FAM 17.6, Feb. 1979, pp. 238–239.

*Primary Examiner*—James B. Mullins
*Attorney, Agent, or Firm*—E. M. Whitacre; P. J. Rasmussen; C. A. Berard, Jr.

[57] ABSTRACT

First and second transistors of first and second types that can exhibit respective first and second potentials of first and second opposite polarities between their respective input and common electrodes when respective currents flow in conduction paths between their respective output and common electrodes. The transistors are connected in cascade with the input electrode of the first transistor connected to an input point, the common electrode of the first transistor connected to the input electrode of the second, and the conduction path of the second transistor coupled to a load. A circuit for operating the first transistor at the first potential to compensate, at least in part, for the second potential comprises a third transistor of the first type to which is applied a potential of the first polarity between its input and common electrodes to establish a current in its conduction path. A current directly related to the current in the conduction path of the third transistor is applied to the common electrode of the second transistor as substantially the entire current flow in its conduction path.

12 Claims, 4 Drawing Figures

VOLTAGE-FOLLOWERS WITH LOW OFFSET VOLTAGES

The present invention relates to voltage-follower circuits with low offset voltages and, in particular, to direct-coupled cascade connections of voltage-follower transistors.

A field-effect transistor (FET) in source-follower configuration is a well known voltage-follower circuit, so-called because the voltage at its source electrode "follows" that at its gate electrode. In that circuit, however, the potential at the source electrode is offset from that at the gate electrode by the gate-source operating potential $V_{GS}$. When a plurality of such circuits are employed in a direct-coupled cascade connection, a substantial cumulative potential offset between input and output terminals is developed. However, direct-coupled, cascaded, voltage-follower circuits can employ transistors of "different type" so to introduce potential offsets of opposite polarity sense. Those potential offsets can compensate each other, either in whole or in substantial part, so that the overall potential offset of the cascaded voltage-follower can be substantially reduced from that which would otherwise obtain.

Transistors referred to as being of different type include those that can be operated so that the respective potentials between their respective input and common electrodes are of opposite polarity sense when the transistors exhibit substantial conduction between their output and common electrodes. The input, output and common electrodes are, respectively, the gate, drain and source of a FET or the base, collector and emitter of a bipolar transistor.

For example, enhancement-mode transistors which exhibit conduction for positive input-to-common electrode potentials are of different type than are depletion-mode transistors which exhibit conduction for negative input-to-common electrode potentials. Thus, enhancement-mode transistors encompass enhancement-mode FETs as well as bipolar transistors.

High input resistance is desirable in a voltage-follower, such as can be obtained if a FET is employed. But FETs exhibit relatively low transconductance so that varying output current demand causes substantial modulation of their gate-source voltages. Bipolar transistors exhibit relatively high transconductance so their base-emitter voltages vary to a much lesser extent with varying load current demand, but they exhibit much lower input resistances than do FETs. Different type transistors, such as bipolar and FETs, can be employed in combination to obtain the benefits of each.

When combinations of different transistors are employed, however, their input to common electrode potential offsets can differ substantially with load current, temperature or production variables. Therefore, something more is needed where low potential offset $V_{IO}$ is desired.

In the present invention, first and second transistors of first and second types than can exhibit respective first and second potentials of first and second opposite polarities between their respective input and common electrodes when respective currents flow in conduction paths between their respective output and common electrodes. The transistors are connected in cascade with the input electrode of the first transistor connected to an input point, the common electrode of the first transistor connected to the input electrode of the second, and the conduction path of the second transistor coupled to a load. A circuit for operating the first transistor at the first potential to compensate, at least in part, for the second potential comprises a third transistor of the first type to which is applied a potential of the first polarity between its input and common electrodes to establish a current in its conduction path. A current directly related to the current in the conduction path of the third transistor is applied to the common electrode of the second transistor as substantially the entire current flow in its conduction path.

Figure 2:
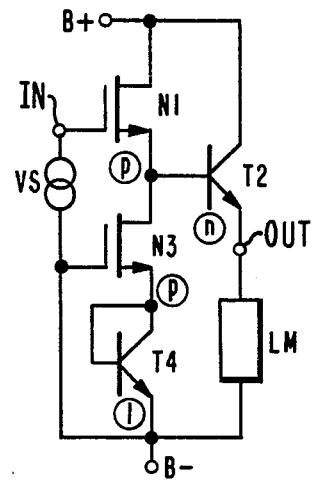
Figure 3:
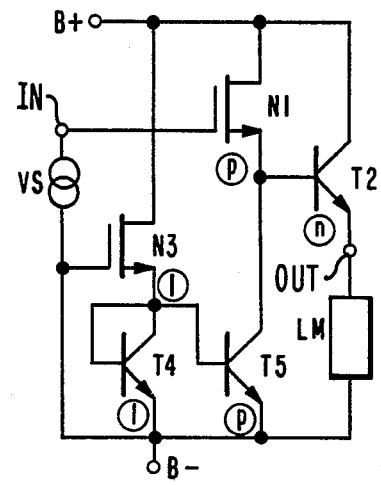
Figure 4:
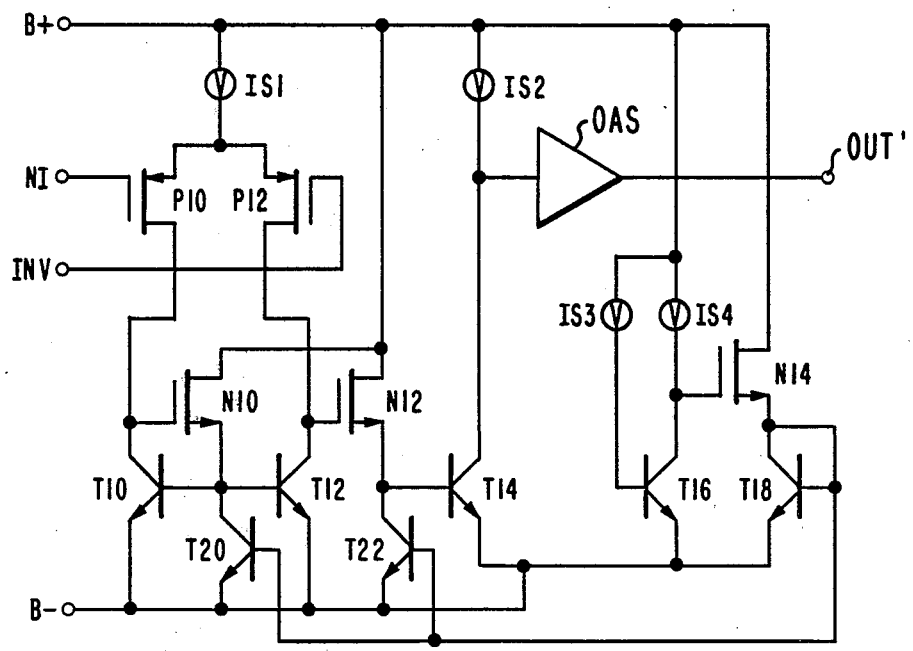

In the drawing:

FIGS. 1, 2 and 3 are schematic diagrams of voltage-follower circuits embodying the present invention in various of its aspects; and FIG. 4 is a schematic diagram of an operational amplifier including an embodiment of the present invention.

In the FIGURES, the relative emitter areas of bipolar transistors and the relative channel width-to-length (W/L) ratios of FETs are indicated by the encircled characters located near their respective emitters or sources. It is noted that the ratios "n" and "p" as applied to FETs indicate their W/L ratio relative to that of a FET having a predetermined value of W/L and that the ratios "n" and "p" as applied to bipolar transistors indicate their emitter areas relative to that of a bipolar transistor having a predetermined value of emitter area; no other relationship between the sizes of FETs and bipolar transistors is implied.

In FIG. 1, input signal potential from voltage source VS is applied to input signal terminal IN and is coupled by the direct-coupled, cascade connection of source-follower depletion-mode P-channel FET P1 and emitter-follower NPN transistor T2 to output signal terminal OUT. Relatively positive operating potential is applied to supply terminal B+, and relatively negative operating potential is applied to supply terminal B−, which can be, for example, at ground potential. Because P1 conducts substantially zero gate current, a very high input resistance is exhibited at terminal IN. The current demanded from the emitter of T2 via terminal OUT by load means LM can be substantially greater than that demanded at its base from the source of P1, i.e., greater by a factor $(\beta+1)$ where $\beta$ is the common-emitter forward-current gain of a bipolar transistor. As a result, the P1, T2 cascaded voltage-follower can drive a relatively very low impedance load LM without significant loading of driving source VS, or modulation of $V_{IO}$ between terminals IN and OUT.

P1 is a depletion-mode P-channel FET and T2 is an NPN bipolar transistor. Their respective input-common conduction potentials $V_{GS}$ and $V_{BE}$ are of opposite polarity sense and can compensate each other so that the potential offset $V_{IO}$ between terminals IN and OUT is desirably reduced. So that potential offset $V_{IO}$ can more closely approach zero volts, P1 is biased to operate at a drain-source channel current that causes its $V_{GS}$ to be of substantially equal magnitude to the $V_{BE}$ of T2, as will now be explained.

To this end, P-channel depletion-mode FET P3 and NPN bipolar transistor T4 are connected to operate at like currents to those of P1 and T2, respectively. T4 is of like device type and preferably of like relative emitter area "n" to T2. P3 is of like device type and preferably of like relative width-to-length (W/L) ratio "1" to P1. Since the collector-emitter paths of T2 and T4 are serially connected so to conduct substantially the same current $I_C$, their emitter current densities and therefore their base-emitter voltages, $V_{BE2}$ and $V_{BE4}$, respectively, will be substantially the same. Since the drain-source channels of P1 and P3 are also serially connected to conduct equal channel current $I_{DS}$, their gate-source potentials, $V_{GS1}$ and $V_{GS3}$, respectively, are also the same. With P3 and T4 connected gate to emitter and source to base so as to operate at equal control potentials, the necessary result is that $$V_{BE2} = V_{BE4} = V_{GS3} = V_{GS1}. \quad (1)$$

Thus, there is substantially no potential offset between terminals IN and OUT.

It is noted that voltage-followers including the present invention exhibit satisfactory performance so long as similar type transistors exhibit quite similar characteristics. In FIG. 1, for example, P-FETs P1 and P3 exhibit similar $I_{DS}$ v. $V_{GS}$ transconductance characteristics, and T2 and T4 exhibit similar $I_C$ v. $V_{BE}$ transconductance characteristics. Sufficient similarity can be inherently obtained, for example, when the voltage-follower circuit is constructed as an integrated circuit without need for special selection, processing, or trimming adjustments. It is important to note that the difficult problem of obtaining matching of characteristics between transistors of different types is substantially avoided when the present invention is employed. That advantage obtains even when the cascaded followers are both FETs or both bipolar transistors.

In FIG. 2, signal at terminal IN from source VS is coupled by source-follower N-channel depletion-mode FET N1 in cascade connection with emitter-follower NPN transistor T2 to terminal OUT. In this circuit, it is desired that the potential at terminal OUT not be substantially offset from that at terminal IN. This is accomplished by conditioning FET N1 to operate so as to demand a gate-source potential which is of substantially the same magnitude as the base-emitter potential of T2, but which is of opposite polarity sense. To that end, N-channel depletion-mode FET N3, exhibiting substantially the same transconductance characteristics as does FET N1, is biased to supply from its drain a current to the source of N1.

To so condition FET N1, NPN transistor T4 has its base connected to the source of N3 and its emitter connected to the gate of N3 to develop therebetween a potential substantially the same as the base-emitter potential of T2. FET N3 is conditioned by its gate being $1V_{BE}$ more negative than its source to conduct a predetermined drain-source channel current, which current flows in the serially-connected circuit including the drain-source channels of FETs N1 and N3 and the collector-emitter path of T4. Because FETs N1 and N3 exhibit the same transconductance characteristics and conduct the same drain-source current, and because N3 is biased to a predetermined gate-source potential, FET N1 is conditioned to operate at substantially that same gate-source potential. In this manner, the gate-source potential of N1 is caused to be substantially equal to the base-emitter potential of T2 but is of opposite polarity sense so that the potential offset $V_{IO}$ between terminals IN and OUT is substantially reduced to zero volts.

Because it is desirable to minimize quiescent current consumption, a greater magnitude quiescent current will ordinarily be established in the T2, LM path than in the N1, N3, T4 path. So that the respective base-emitter potentials of T2 and T4 are more exactly matched under that condition, T2 and T4 are preferably selected to have respective relative emitter areas of "n" and unity, where "n" is selected to be the ratio of the value of collector-emitter current in T2 to the value of the drain-source current of N1 and N3. As a result, T2 and T4 operate at substantially equal emitter current densities. In particular, N1 and N3 are selected to have channels of the same width-to-length (W/L) ratio "p" so that their drain-source current versus gate-source potential characteristics are alike.

FIG. 3 shows an alternative voltage-follower circuit modified from that of FIG. 2 in that the channel current of N3 is not applied directly to the source of N1 from the drain of N3, but rather is applied indirectly from the source of N3 via the current mirror amplifier (CMA) including diode-connected NPN transistor T4 and a further NPN transistor T5 connected at its collector to the source of N1.

This voltage-follower circuit is particularly advantageous when input signals from VS tend to be close to the B− operating potential. Each of transistors N1, N3, T2 and T4 is operated in analogous manner to that described above in relation to the circuit of FIG. 2. The T4, T5 CMA receives drain-source current from N3 at the collector of T4 and supplies a current directly related thereto from the collector of T5 to the source of N1. As described above, T2 and T4 have selected relative emitter areas so to operate at substantially the same emitter current density, thereby exhibiting substantially equal base-emitter potentials. T4 base-emitter potential is applied as gate-source potential to N3 to establish a current in its drain-source channel of a given current density. Channel current, preferably of that same density, is established in the drain-source channel of N1 from the T4, T5 CMA. When the current gain ratio "p" of the T4, T5 CMA is desirably selected the same as the ratio of the relative W/L ratios of N1 to N3, substantially equal gate-source voltages for N1 and N3 will obtain.

This arrangement desirably allows N1 to be constructed with a large channel area so that it exhibits high transconductance "gm" while N3 may be constructed with smaller channel area, so to reduce the amount of chip area required when the circuit of FIG. 3 is constructed in integrated circuit form.

FIG. 4 shows an operational amplifier, wherein arrangements of the sort shown in FIG. 3 for establishing the source current of a source-follower FET are of particular benefit for compensating the potential offset across the input circuit of a transistor in common-emitter amplifier connection. This amplifier illustrates that the present invention can be beneficially employed with circuits other than cascaded voltage-followers. The inverting and non-inverting input signal terminals INV and NI of this operational amplifier are at the gates of P-channel enhancement-mode FETs P10 and P12, respectively. P10 and P12 are connected in long-tailed-pair configuration to receive their combined source currents from current source IS1. Their drain currents are differentially combined in a balanced-to-single-ended signal converter including T10, T12 and N10 and, after intermediate amplification, applied to an output amplifier stage OAS for further amplification before application to output terminal OUT'.

One desirable property in such an operational amplifier is the capability to operate with the input signal terminals more negative than its negative operating potential B−. This property is afforded to greatest degree when the drains of P10 and P12 are operated as close to B− potential as possible, so their interconnected sources can follow a negative swing of either of their gates as far as possible towards B− without interfering with normal transistor operation.

The drain current of P10 is inverted in a CMA comprising NPN master mirroring transistor T10, source-follower N-channel depletion-mode FET N10, and NPN slave mirroring transistor T12. In general, this current mirror amplifier resembles that described by O. H. Schade, Jr. in U.S. Pat. No. 4,008,441 CURRENT AMPLIFIER issued Feb. 15, 1977. Specifically, it differs in that N10 is a depletion-mode FET biased to provide a $V_{GS}$ potential of equal magnitude to the $V_{BE}$s of T10 and T12, less the emitter-to-collector voltage $V_{SAT}$ of NPN transistor T16 which is biased to saturation. This $V_{GS}$ potential is of a polarity to offset the $V_{BE}$s of T10 and T12, so the direct-coupled collector-to-base feedback source-follower N10 biases the collector of T10 at a potential removed from B− potential by about $V_{SAT}$. This is the closest the collector potential of T10 can be to B− potential without interfering with its normal transistor operation.

N10 is biased to exhibit a $V_{GS}$ potential of $(V_{BE}-V_{SAT})$, much as N1 was biased to exhibit an offset of $V_{BE}$ in FIGS. 2 and 3. N-channel depletion-mode FET N14 corresponds to N3 in its operation, and NPN bipolar transistors T18 and T20, connected as a CMA, correspond respectively to T4 and to T5 in their operation. The difference is that a potential $V_{SAT}$ is interposed between the gate of N14 and the joined emitters of T18 and T20. This $V_{SAT}$ potential is developed between the emitter and collector of NPN transistor T16, forced to operate in saturation because currents applied to its collector and base from current sources IS4 and IS3, respectively, are in a ratio less than β. Saturation is understood to mean the condition where the collector potential is sufficiently reduced that there is forward conduction across the collector-base junction of T16 reducing its apparent β to the ratio between the collector and base currents applied.

The drain current of P10 appears inverted at the collector of T12 and is there combined with the drain current of P12 to provide a single-ended signal for application to the intermediate amplifier stage comprising source-follower N-channel depletion-mode FET N12 in cascade connection with common-emitter-amplifier NPN transistor T14. T14 is shown with constant current generator IS2 as a high-resistance collector load to develop a voltage gain of several hundred times. N12 is biased to provide a $V_{GS}$ potential similar to that N10 provides, as a result of the application of the collector current of NPN transistor T22 to the source of N12. T22 has its base-emitter junction paralleling those of T18 and T20 and demands the same collector current as T20. That is, the combination of T18, T20 and T22 functions as a dual-output CMA. When a direct-coupled degenerative feedback connection (not shown) is completed between the terminals OUT' and INV, the potential at the gate of N12 and the drain of P12 becomes regulated to $V_{SAT}$.

Current source IS4 is preferably chosen to operate T16 at similar emitter current density to that of T10 when T10 conducts the entirety of the current from IS1, i.e., when P10 is fully conductive and P12 is fully non-conductive. Current source IS2 is preferably chosen to operate T14 at similar emitter current density to that at which T10 and T12 are operated when the current supplied by IS1 is equally divided between them. This places the drain potentials of P10 and P12 as close to B− operating potential as possible while permitting substantially normal transistor action of T10 and T12.

Modifications to the above-described embodiments are contemplated and the scope of the present invention should be limited only by the claims following. For example, in the circuits of FIGS. 1, 2 and 3, NPN transistors T2, T4, and T5 can be replaced by N-channel enhancement-mode FETs. It is further contemplated that the embodiments described herein can be desirably embodied in integrated circuit form, wherein the scaling of relative emitter areas of bipolar transistors, the scaling of relative W/L ratios of FETs, and the controlling of their conduction characteristics may be accomplished conveniently and accurately.

Moreover, in the circuit of FIG. 4, FETs N10, N12 and N14 can be replaced by P-channel FETs operated in enhancement mode and NPN transistors T16, T18, T20 and T22 replaced by PNP transistors. In that modification, the respective drains of the recited FETs would connect to B− potential, the respective emitters of the recited PNP transistors would connect to B+ potential, and current sources IS3 and IS4 would respectively connect the base and collector of PNP transistor T16 to B− potential to bias PNP T16 to saturation.

It is understood that the transistors which can be employed in the present invention are not limited to the specific exemplary types described herein. The present invention is desirably employed when depletion- and enhancement-mode FETs of like channel conductivity are cascade connected, where FETs of like mode (either depletion or enhancement) and complementary channel conductivity are cascade connected. In integrated circuits, vertical NPN and lateral PNP transistors, having $I_C$ v. $V_{BE}$ characteristics that are difficult to predict or match, can be employed in cascade connection. The present invention substantially avoids the need to match the NPN and PNP transistors to each other, and the inherent matching between the NPN transistors and that between the PNP transistors is sufficient. Further, enhancement-mode transistors include FETs of that type as well as bipolar transistors; depletion-mode transistors include FETs of that type as well as enhancement-mode FETs that are operated at $V_{GS}$ less than the $V_{BE}$ of a bipolar transistor.

What is claimed is:

1. In a circuit including:
   first and second transistors each having respective input, output and common electrodes, said transistors being of respective first and second types that can exhibit respective first and second potentials of first and second opposite polarities between their respective input and common electrodes when currents flow in respective conduction paths between their respective output and common electrodes;
   means for connecting said first and second transistors in cascade including a connection of the input electrode of said first transistor to an input point and for connecting the common electrode of said first transistor to the input electrode of said second transistor;
   load means coupled to the conduction path of said second transistor for receiving the current flow therethrough; and circuit means for conditioning said first transistor to exhibit said first potential of magnitude to compensate at least a portion of said second potential, said circuit means comprising:
a third transistor of said first type and having input, output and common electrodes; and
a current amplifier having an input connection to which the common electrode of said third transistor connects, having an output connection to which the common electrode of said first transistor is coupled, having a common connection against which the input electrode of said third transistor is biased, said current amplifier having an input circuit between its input and common connections for applying a potential of said first polarity between the input and common electrodes of said third transistor to establish a current in its conduction path, and having an output circuit between its output and common connections for applying a current directly related to the current in the conduction path of said third transistor to the common electrode of said first transistor as substantially the entire current flow in its conduction path.

2. In a circuit including:
first and second transistors each having respective input, output and common electrodes, said transistors being of respective first and second types that can exhibit respective first and second potentials of first and second opposite polarities between their respective input and common electrodes when currents flow in respective conduction paths between their respective output and common electrodes;
means for connecting said first and second transistors in cascade including a connection of the input electrode of said first transistor to an input point and for connecting the common electrode of said first transistor to the input electrode of said second transistor;
load means coupled to the conduction path of said second transistor for receiving the current flow therethrough; and
circuit means for conditioning said first transistor to exhibit said first potential of magnitude to compensate at least a portion of said second potential, said circuit means comprising:
a third transistor of said first type and having input output and common electrodes, said circuit means having an input connection to which the output electrode of said second transistor is coupled, having an output connection to which the common electrode of said first transistor is coupled, and having a common connection, said circuit means having an input circuit between its input and common connections for applying a potential of said first polarity between the input and common electrodes of said third transistor to establish a current in its conduction path, and said circuit means having an output circuit between its output and common connections for applying a current directly related to the current in the conduction path of said third transistor to the common electrode of said first transistor as substantially the entire current flow in its conduction path.

3. The circuit as set forth in claim 1 or 2 wherein said input circuit includes semiconductor junction means connected between the input and common electrodes of said third transistor.

4. The circuit as set forth in claim 3 wherein said semiconductor junction means includes a fourth transistor of said second type, having input and common electrodes respectively connected to the common and input electrodes of said third transistor, and having an output electrode.

5. The circuit as set forth in claim 4 wherein said fourth transistor is an enhancement-mode transistor.

6. The circuit as set forth in claim 5 wherein said fourth transistor is a bipolar transistor.

7. The circuit as set forth in claim 1 or 2 wherein said first and third transistors are depletion-mode field-effect transistors and wherein said second transistor is an enhancement-mode transistor.

8. The circuit as set forth in claim 7 wherein said second transistor is a bipolar transistor.

9. The circuit as set forth in claim 1 wherein said input circuit of said current amplifier further includes:
means for developing a third potential of magnitude to substantially compensate the entire said second potential;
means for developing a fourth potential of magnitude substantially smaller than said second potential; and
means for applying the difference between said third and fourth potentials between the input and common electrodes of said third transistor as said potential of said first polarity applied therebetween.

10. The circuit as set forth in claim 9 wherein said means for developing a fourth potential comprises:
a fifth transistor having an input electrode, and having output and common electrodes between which said fourth potential is developed; and
means for applying operating bias signals to the input and output electrodes of said fifth transistor for conditioning it to operate with the potential at its output electrode closer to that at its common electrode than is the potential at its input electrode.

11. A circuit comprising:
first and second transistors each having output and common electrodes and a conduction path therebetween, and each having an input electrode, one of said first and second transistors being of depletion-mode type and the other thereof being of enhancement-mode type, wherein the input electrode of said first transistor is coupled to an input terminal, the common electrode of said first transistor is coupled to the input electrode of said second transistor, and the conduction path of said second transistor is coupled to an output terminal;
a third transistor having output and common electrodes and a conduction path therebetween, and having an input electrode, said third transistor being of the same type as said first transistor;
a current amplifier having an input connection coupled to the common electrode of said third transistor, an output connection coupled to the common electrode of said first transistor and a common connection coupled to the input electrode of said third transistor, said current amplifier having an input circuit between its input and common connections for biasing said third transistor to apply a current to the input connection of said current amplifier to produce a current at the output connection thereof which conditions said first transistor to exhibit a potential between its input and common electrodes having a magnitude to compensate at least a portion of the potential between the input and common electrodes of said second transistor.

12. The circuit of claim 11 wherein said input circuit includes a fourth transistor of the same type as said second transistor, having input and common electrodes coupled to the common and input electrodes of said third transistor, and having an output electrode.

* * * * *